United States Patent [19]

Sannomiya et al.

[11] Patent Number: 4,698,658

[45] Date of Patent: Oct. 6, 1987

[54] AMORPHOUS SEMICONDUCTOR DEVICE

[75] Inventors: Hitoshi Sannomiya, Osaka; Masaya Hijikigawa, Yamatokoriyama, both of Japan

[73] Assignee: Sharp Kabushiki Kaisha, Osaka, Japan

[21] Appl. No.: 756,854

[22] Filed: Jul. 19, 1985

[30] Foreign Application Priority Data

Jul. 24, 1984 [JP] Japan ................. 59-154587

[51] Int. Cl.$^4$ ........................... H01L 27/14
[52] U.S. Cl. ........................ 357/30; 357/2; 357/4; 357/58
[58] Field of Search ............ 357/2, 30, 58, 4

[56] References Cited

U.S. PATENT DOCUMENTS 4,387,265  6/1983  Dalal .................... 136/249

FOREIGN PATENT DOCUMENTS 55-16494  2/1980  Japan .
0113296  7/1982  Japan ..................... 357/2
0105379  6/1984  Japan ..................... 357/2
2047463  11/1980  United Kingdom .

OTHER PUBLICATIONS

"Formation Kinetics and Control of Microcrystalline in $\mu$c-Si:H from Glow Discharge Plasma", A. Matsuda, Journal of Non-Crystalline Solids, 59 & 60 (1983), 767-774.

Primary Examiner—James W. Davie
Assistant Examiner—Georgia Y. Epps
Attorney, Agent, or Firm—Barnes & Thornburg

[57] ABSTRACT

An amorphous semiconductor device comprising a layered structure having a p-amorphous silicon layer, an i-amorphous silicon layer, an n-amorphous silicon layer, an i-amorphous silicon layer and a p-amorphous silicon layer, or an n-amorphous silicon layer, an i-amorphous silicon layer, a p-amorphous silicon layer, an i-amorphous silicon layer and an n-amorphous silicon layer, in sequence, on a substrate, electrodes being disposed on the top layer, the central layer and the bottom layer, respectively.

4 Claims, 11 Drawing Figures

AMORPHOUS SEMICONDUCTOR DEVICE

BACKGROUND OF THE INVENTION

1. Field of the Invention

This invention relates to an amorphous semiconductor device having a structure which is operable as a color sensor.

2. Description of the Prior Art

FIG. 11 shows a conventional semiconductor color sensor comprising a p-Si crystal layer 1, an n-Si crystal layer 2 and a p-Si crystal layer 3, on each of which electrodes I, II and III are disposed, respectively, to form, in Si crystal chips, double photodetectors, one of which is composed of a photodiode containing a PN junction at the upper position therein, having a sensitivity to short wavelengths and the other of which is a photodiode containing another PN junction at the lower position therein, having a sensitivity to long wavelengths. The upper photodiode has the function of a filter for the lower photodiode. The ratio of the short-circuit current between the electrodes I and II of the upper photodiode to the short-circuit current between the electrodes II and III of the lower photodiode is represented by a first-order function of the wavelength of the incident light ray thereupon, and thus this conventional semiconductor color sensor can detect the color of an incident light ray.

SUMMARY OF THE INVENTION

The amorphous semiconductor device of this invention comprises a layered structure having a p-a-morphous silicon layer, an i-amorphous silicon layer, an n-amorphous silicon layer, an i-amorphous silicon layer and a p-amorphous silicon layer, or an n-a-morphous silicon layer, an i-amorphous silicon layer, a p-amorphous silicon layer, an i-amorphous silicon layer and an n-amorphous silicon layer, in sequence, on a substrate, electrodes being disposed on the top layer, the central layer and the bottom layer, respectively.

The central layer is, in a preferred embodiment, composed of two layered parts which sandwich a transparent conductive layer therebetween.

The substrate is, in a preferred embodiment, a light-permeable substrate, on one side of which the p-, i- and n- amorphous silicon layers or the n-, i-and p- amorphous silicon layers are formed in sequence, and on the other side of which the n-, i- and p- amorphous silicon layers or the p-, i- and n- amorphous silicon layers are formed in sequence.

Each of the amorphous silicon layers on the substrate contains, in a preferred embodiment, a slightly crystalline film.

The p-i-n- or n-i-p- layered structure on the side receiving the incident light ray constitutes a first photodiode and the remaining n-i-p- or p-i-n-layered structure at the lower position constitutes a second photodiode, said first and second photodiodes being, in a preferred embodiment, connected to a signal processing circuit to result in an output represented by a first-order function of the wavelength of the incident light ray thereupon.

Thus, the invention described herein makes possible the objects of (1) providing an amorphous semiconductor device which is operable as a color sensor using amorphous silicon instead of crystal silicon in the above-mentioned conventional color sensor; (2) providing an amorphous semiconductor device which operates in the same manner as the conventional semiconductor device and moreover is inexpensive since the amorphous silicon used therefor is extremely cheaper than the crystal silicon; (3) providing an amorphous semiconductor device which has the desired shape and-/or the desired size by the formation of a thin amorphous silicon film on a light-permeable substrate such as glass, metal or the like; and (4) providing an amorphous semiconductor device as a unit of a color sensor which can be formed by integrating a number of the said amorphous semiconductor devices onto one substrate.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
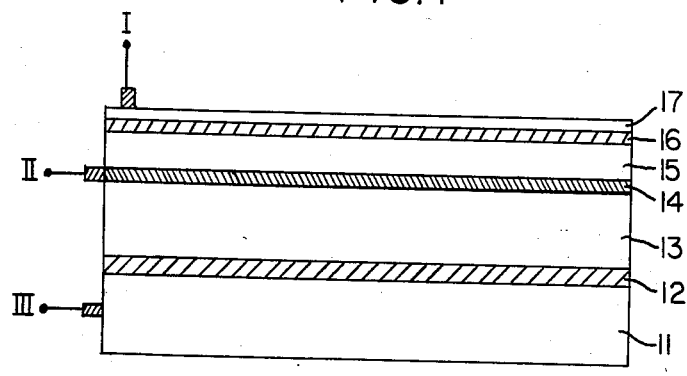
FIG. 1 is a schematic diagram showing the structure of an amorphous semiconductor device of this invention.

FIG. 1 shows the structure of an amorphous semiconductor device of this invention, wherein a boron doped p-amorphous silicon layer 12, a non-doped or a slightly boron doped i-amorphous silicon layer 13, a phosphorous doped n-amorphous silicon layer 14, a non-doped or a slightly boron doped i-amorphous silicon layer 15, a boron doped p-amorphous silicon layer 16 and a transparent conductive film 17 made of indium oxide, tin oxide, an indium oxide-tin oxide ($In_2O_3+SnO_2$, $SnO_2 \leq 10\%$) alloy or the like are, in sequence, laminated on a metal substrate 11. Electrodes I, II and III are disposed on the transparent conductive film 17 at the top, the n-amorphous silicon layer 14 at the central position and the metal substrate 11 at the bottom, respectively. As mentioned above, the amorphous semiconductor device of this invention has a p-i-n-i-p-layered structure, but is not limited thereto. The device can be of a n-i-p-i-n- layered structure, in which current flows in the reverse of that in the above-mentioned p-i-n-i-p- layered structure, although it operates in the same manner as the above-mentioned.

When each of the n- (or p-) amorphous silicon layers has a high resistance so that a sufficient current can not generate from the device, a slightly crystalline film can be added to each of the n- (or p-) amorphous silicon layers as desired.

Figure 2:
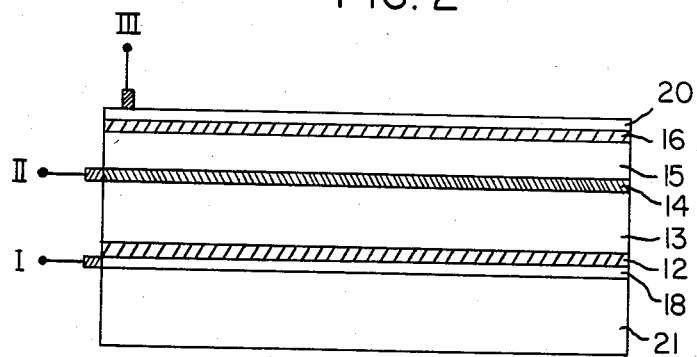
FIGS. 2 to 5 are schematic diagrams showing the structures of other amorphous semiconductor devices of this invention, respectively.

FIG. 2 shows the structure of another amorphous semiconductor device of this invention, which comprises a light-permeable substrate 21 such as glass, etc., a transparent conductive film layer 18, a p-a-morphous silicon layer 12, an i-amorphous silicon layer 13, an n-amorphous silicon layer 14, an i-amorphous silicon layer 15, a p-amorphous silicon layer 16 and a metal film 20, in sequence. Electrodes I, II and III are disposed on the transparent conductive film layer 18, the n-amorphous silicon layer 14 and the metal film 20, respectively. This device using the light-permeable substrate 21 in FIG. 2, is different from the afore-mentioned device, using the metal substrate 11 in FIG. 1 in that since the light-permeable substrate 21 is not electrically conductive, the transparent conductive film 18 is disposed between the light-permeable substrate 21 and the p-amorphous silicon layer 12. The transparent conductive film 18 is preferably composed of a double layered structure of indium oxide-tin oxide and tin oxide to improve the characteristics of the device.

Figure 3:
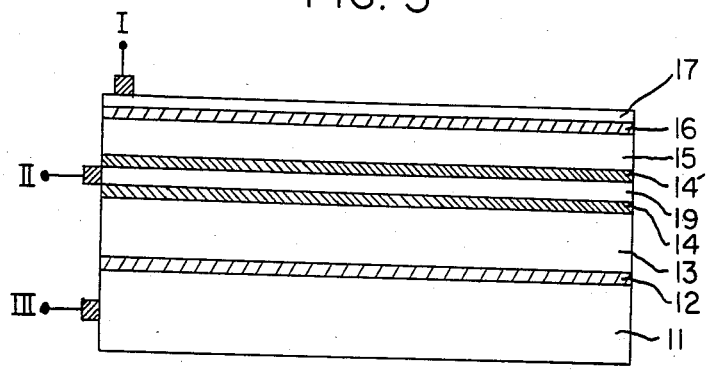

FIG. 3 shows the structure of another amorphous semiconductor device of this invention, wherein the n- (or p-) amorphous silicon layer corresponding to the n- (or p-) amorphous silicon layer 14 in FIG. 1 is composed of two layered parts 14 and 14' which sandwich a transparent conductive film 19 therebetween, so that current can be readily released from the device even though the n- (or p-) amorphous silicon layer has a high resistance.

Figure 4:
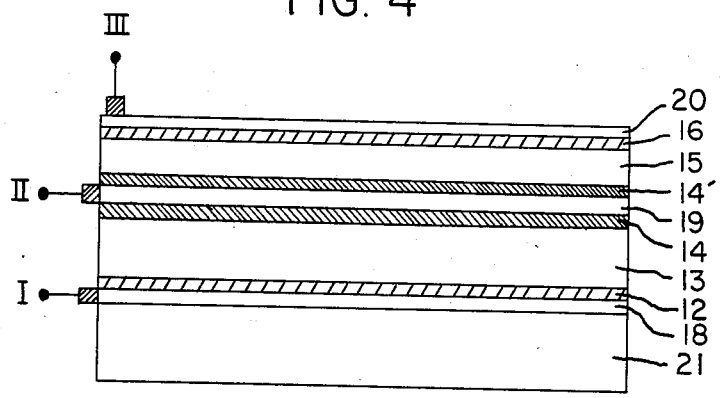

FIG. 4 shows the structure of another amorphous semiconductor device of this invention, wherein the n- (or p-) amorphous silicon layer corresponding to the n- (or p-) amorphous silicon layer 14 in FIG. 2 is composed of two layered parts 14 and 14', as well, which sandwich a transparent conductive film 19 therebetween, thereby attaining the same effect as in the device shown in FIG. 3.

Figure 5:
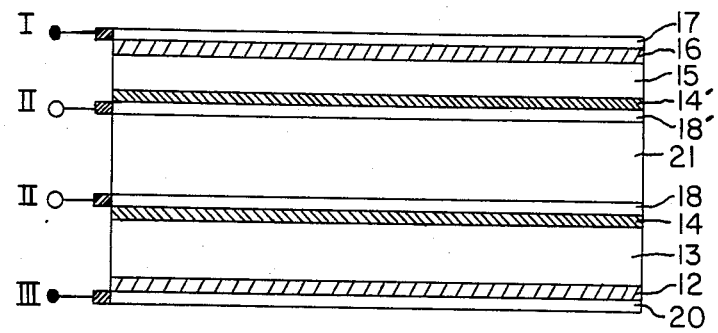

FIG. 5 shows the structure of another amorphous semiconductor device of this invention, wherein on one side of a light-permeable substrate 21 such as glass, etc., a transparent conductive film layer 18', an n-amorphous silicon layer 14', an i-amorphous silicon layer 15, a p-amorphous silicon layer 16 and a transparent conductive film 17 are, in sequence, laminated, while on the other side of the light-permeable substrate 21, a transparent conductive film layer 18, an n-amorphous silicon layer 14, an i-amorphous silicon layer 13, a p-amorphous silicon layer 12 and a metal film 20 are, in sequence, laminated. To the transparent conductive film 17, a first terminal I is attached. Second terminals II and II are attached to the transparent conductive film layers 18 and 18', respectively. A third terminal III is attached to the metal film 20.

Figure 6:
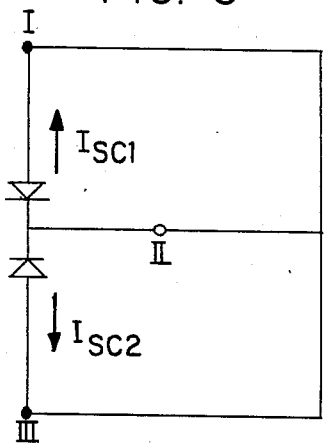
FIG. 6 is a network at a time when each of the output terminals of the amorphous semiconductor device of this invention are short-circuited.

The operation of the device shown in FIG. 1 is explained, as follows, by reference to FIG. 6 showing the network at at time when the electrodes I and II and the electrodes II and III, respectively, are short-circuited.

Figure 7:
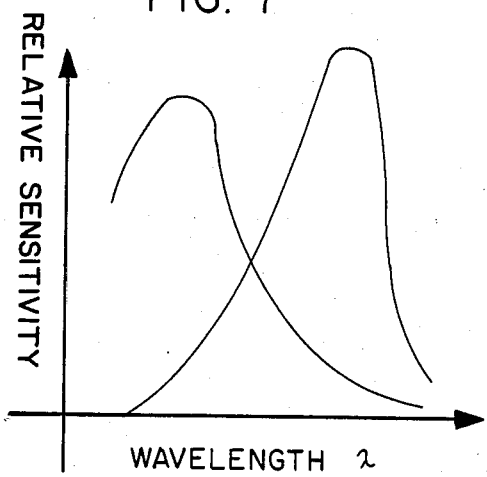
FIG. 7 is a graph showing curves of the spectroscopic sensitivity characteristic of the amorphous semiconductor device of this invention.

Upon incidence of a light ray on the transparent electrode 17, the short-circuit currents $Isc_1$ and $Isc_2$, respectively, generate from the first photodiode of the p-i-n-layered structure composed of the p-layer 16, the i-layer 15 and the n-layer 14 and the second photodiode of the n-i-p- layered structure composed of the n-layer 14, the i-layer 13 and the p-layer 12. The first photodiode of the p-i-n- layered structure composed of the layers 14 to 16 functions as a filter for the second photodiode of the n-i-p-layered structure of the layers 12 to 14, and thus, as shown in FIG. 7, the spectroscopic sensitivity characteristic of the first photodiode on the side receiving the incident light ray exhibits the maximum sensitivity to short wavelengths while that of the second photodiode at the lower positon thereof exhibits the maximum sensitivity to long wavelengths.

Figure 8:
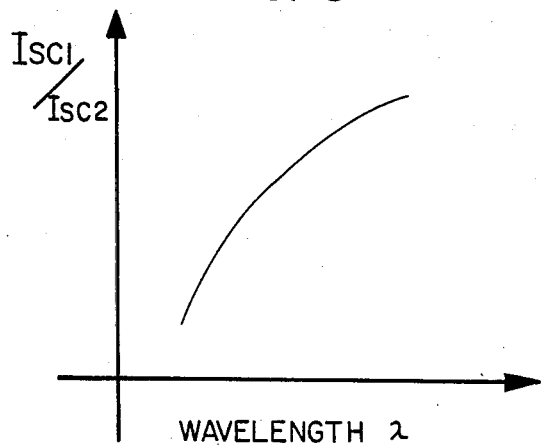
FIG. 8 is a graph showing the curve of the dependence of the short-circuit currents from a device of this invention upon the wavelength of an incident light ray.

FIG. 8, showing the relationship between the wavelength of an incident light ray and the ratio of the short-circuit current $Isc_1$ to the short-circuit current $Isc_2$, indicates that the ratio of $Isc_1$ to $Isc_2$ is represented by a first-order function of the wavelength of the incident light ray upon the device, resulting in an output represented by a first-order function of a specifc wavelength. Thus, the device of this invention acts as a color sensor.

Figure 9:
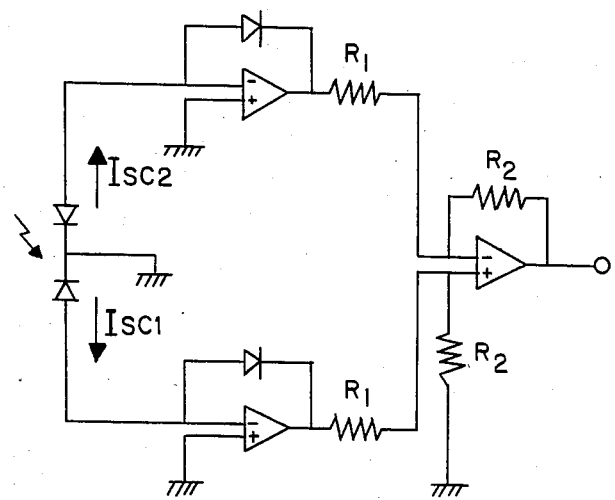
FIG. 9 is a signal processing circuit to be connected to a device of this invention.
Figure 10:
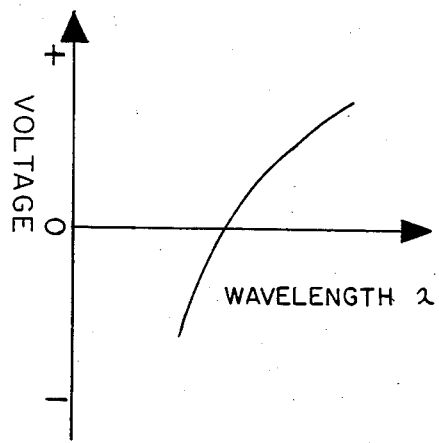
FIG. 10 is a graph showing the curve of the dependence of the output voltage from the signal processing circuit connected to a device upon the wavelength of an incident light ray.
Figure 11:
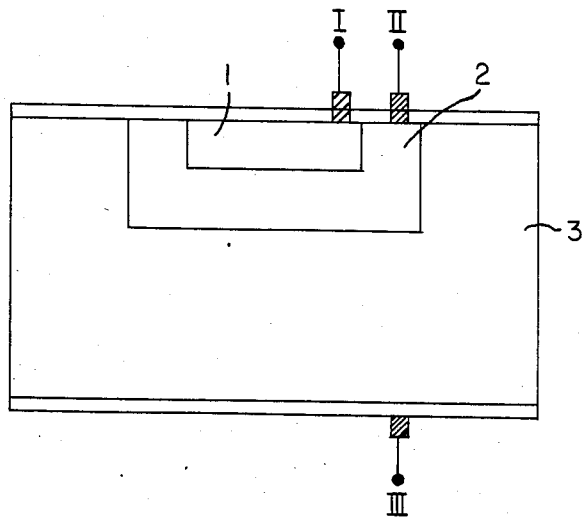
FIG. 11 is a schematic diagram showing the structure of a conventional color sensor using crystal silicon therefor.

When a signal processing circuit (e.g., the circuit shown in FIG. 9) is connected to the electrodes I, II and III of this device, the voltage represented by a first-order function of a specific wavelength can be supplied.

Devices having the structures shown in FIGS. 2 to 5 also operate in the same manner as the above-mentioned device in FIG. 1.

It is understood that various other modifications will be apparent to and can be readily made by those skilled in the art without departing from the scope and spirit of this invention. Accordingly, it is not intended that the scope of the claims appended hereto be limited to the description as set forth herein, but that the claims be construed as encompassing all the features of patentable novelty which reside in the present invention, including all features which would be treated as equivalents thereof by those skilled in the art to which this invention pertains.

What is claimed is:

1. An amorphous semiconductor device for a color sensor comprising:
   the following sequentially layered structure on a substrate:
   a first doped amorphous silicon layer of a first conductivity,
   a first intrinsic amorphous silicon layer,
   a second doped amorphous silicon layer of a second conductivity type opposite said first conductivity type,
   a second intrinsic amorphous silicon layer,
   a third doped amorphous silicon layer of said first conductivity type;
   first, second and third electrodes connected respectively to said first, second and third doped amorphous silicon layers;
   a first photo diode formed by said first and second doped amorphous silicon layers between said first and second electrodes having a different sensitivity to wavelengths of light than a second photo diode formed by said second and third doped amorphous silicon layers between said second and third electrode.

2. An amorphous semiconductor device according to claim 1, wherein said second doped amorphous silicon layer is composed of two layered parts which sandwich a transparent conductive layer therebetween.

3. An amorphous semiconductor device according to claim 1, wherein said substrate is a light-permeable substrate, and said second doped amorphous silicon layer is composed of two layered parts which sandwich said light-permeable substrate therebetween.

4. A color sensor comprising:

the following sequentially layered structure on a substrate:

a first doped amorphous silicon layer of a first conductivity, a first intrinsic amorphous silicon layer, a second doped amorphous silicon layer of a second conductivity type opposite said first conductivity type, a second intrinsic amorphous silicon layer, a third doped amorphous silicon layer of said first conductivity type;

first, second and third electrodes connected respectively to said first, second and third doped amorphous silicon layers;

a first photo diode formed by said first and second doped amorphous silicon layers between said first and second electrodes having a different sensitivity to wavelengths of light than a second photo diode formed by said second and third doped amorphous silicon layers between said second and third electrode; and a signal processing circuit connected to said first, second and third electrodes for receiving an output from said first and second photo diodes representing a first-order function of the wavelength of the incident light ray on said photo diodes.

* * * * *